United States Patent
Söderbärg et al.

[11] Patent Number: 6,121,668
[45] Date of Patent: Sep. 19, 2000

[54] SEMICONDUCTOR DEVICE PROVIDED WITH CONDUCTOR ELECTRICALLY CONNECTED TO CONDUCTING REGION

[75] Inventors: Anders Söderbärg, Uppsala; Nils Ögren, Vällingby; Håkan Sjödin, Knivsta; Ivar Hamberg, Stockholm, all of Sweden

[73] Assignee: Telefonaktiebolaget LM Ericsson, Stockholm, Sweden

[21] Appl. No.: 09/045,636

[22] Filed: Mar. 23, 1998

[30] Foreign Application Priority Data

Mar. 27, 1997 [SE] Sweden .................................. 9701156

[51] Int. Cl.⁷ .............................. H01L 29/00; H01L 23/58
[52] U.S. Cl. .......................... 257/510; 257/513; 257/520; 257/487
[58] Field of Search .................................. 257/505, 506, 257/520, 521, 523, 501, 503, 510–513, 524, 349, 554, 526, 487, 493, 374; 438/355, 405

[56] References Cited

U.S. PATENT DOCUMENTS

| | | |
|---|---|---|
| 5,241,210 | 8/1993 | Nakagawa et al. ..................... 257/487 |
| 5,373,183 | 12/1994 | Beasom ................................... 257/520 |
| 5,449,946 | 9/1995 | Sakakibara et al. ..................... 257/505 |
| 5,557,134 | 9/1996 | Sugisaka et al. ........................ 257/506 |

FOREIGN PATENT DOCUMENTS

| | | |
|---|---|---|
| 0 596 264 | 5/1994 | European Pat. Off. . |
| 0 628 996 | 12/1994 | European Pat. Off. . |
| 404048647A | 2/1992 | Japan . |

OTHER PUBLICATIONS

Cristoleveaunu S. et al., "Electrical Characterization of Silicon–On–Insular Materials and Devices", Kluwer Academic Publishers, Mass. USA, Chapter 2, pp. 7–44.

Sze, S.M., "VLSI Techology—2nd Edition", 1988, McGraw–Hill Book Company, New York, USA pp. 45–56.

Primary Examiner—Tom Thomas
Assistant Examiner—Hung Kim Vu
Attorney, Agent, or Firm—Burns, Doane, Swecker & Mathis, L.L.P.

[57] ABSTRACT

A conductor crossing a trench around an electrical component is electrically connected to an isolated intermediate conducting region in order to move the field strength concentrations out of the electrical component and into the intermediate conducting region. This prevents avalanche breakdown from occurring in the electrical component.

13 Claims, 5 Drawing Sheets

SEMICONDUCTOR DEVICE PROVIDED WITH CONDUCTOR ELECTRICALLY CONNECTED TO CONDUCTING REGION

This application claims priority under 35 U.S.C. §§119 and/or 365 to SE 9701156-3 filed in Sweden on Mar. 27, 1997; the entire content of which is hereby incorporated by reference.

BACKGROUND

The present invention relates to a method and device for reducing electric field concentrations in electrical components.

In order to completely isolate components in integrated circuits from each other trench techniques may be used in a silicon-on-insulator (SOI) material. The SOI material which the component is to be formed on may consist of a thin layer of silicon on an insulating material. The component is completely isolated from the surroundings by a trench being etched down to the isolating substrate around the circumference of the component to be isolated. An isolating material, which can differ from that of the insulating substrate, is then deposited in the trench. This leaves components in the form of an island of silicon surrounded by insulating materials-laterally by the filled trench of isolating material and vertically by the insulating substrate.

The insulating substrate and the trench isolating material could be, for example, silicon oxide, silicon nitride, sapphire, aluminium oxide or the like. Trench techniques and SOI technology are know from SZE, S. M., "VLSI Technology—2nd edition" 1988, McGraw-Hill Book Company, New York, USA and from SORIN CRISTOLOVEANU and SHENG S. LI "Electrical Characterisation of Silicon-On-Insulator Materials and Devices" 1995, Kluwer Academic Publishers, Massachusetts, USA.

This technique can be used to isolate high voltage components. However problems can occur owing to the electric field being concentrated at the sharp corner region of the active component. This electric-field concentration reduces the avalanche breakdown voltage of the corner region and this part of the device turns on at a lower voltage than the interior portion of the device. This problem is exacerbated in the case that a conductor with a high-voltage crosses the trench. This can lead to a lower than expected avalanche breakdown where the high-voltage conductor crosses the regions in which the electric-field concentration is highest.

SUMMARY

The present invention solves the problem of how to reduce the occurrence of avalanche breakdown where a high-voltage conductor crosses a region having a high electric-field concentration.

The problem is solved by means of an intermediate conducting region which is used to move the high electric-field concentrations out of a component to be protected.

The components produced according to the invention have an increased resistance to avalanche breakdown where a conductor crosses a trench which means that the distance between components and conductors can be reduced or the component can handle a higher voltage.

BRIEF DESCRIPTION OF THE DRAWINGS

The invention will be described in more detail below by means of an example of an embodiment of the invention which is illustrated in the figures where.

DETAILED DESCRIPTION

Figure 1A:
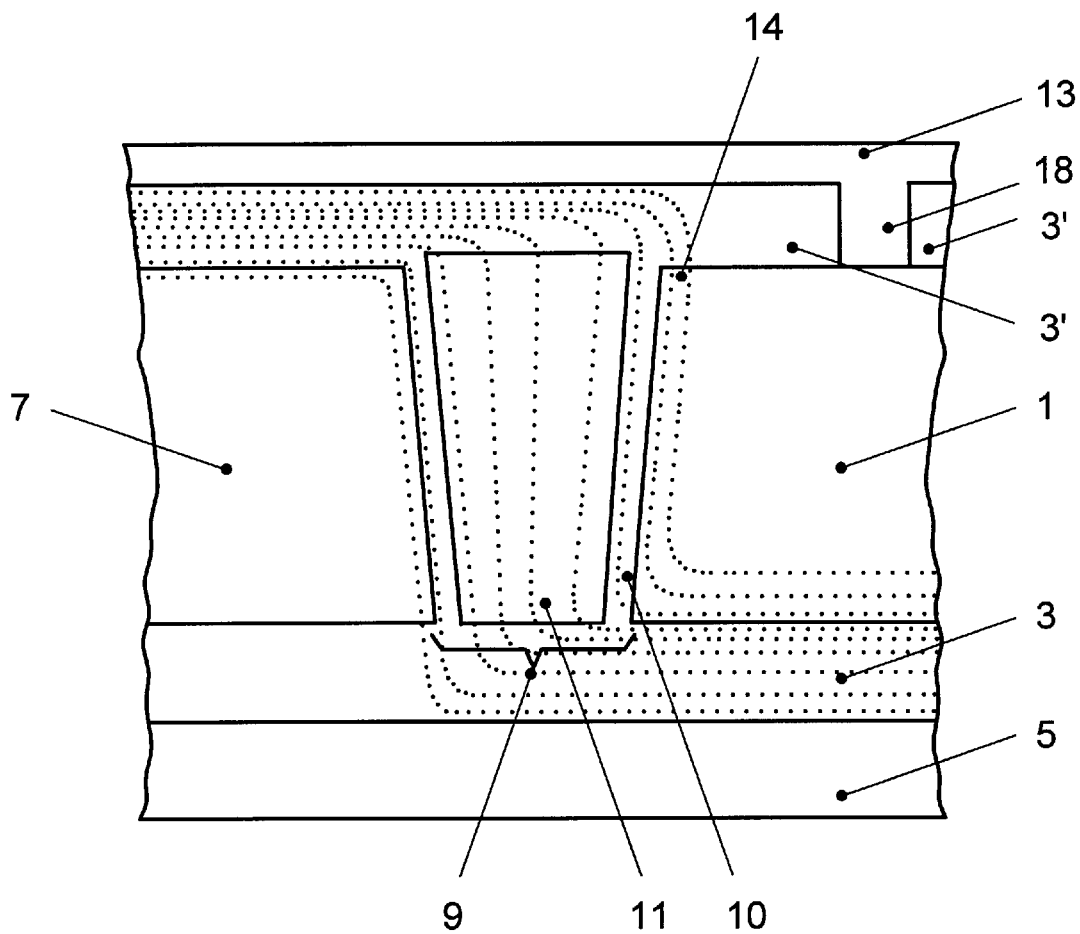
FIG. 1a shows a section through line I—I of the component in FIG. 1b.
Figure 1B:
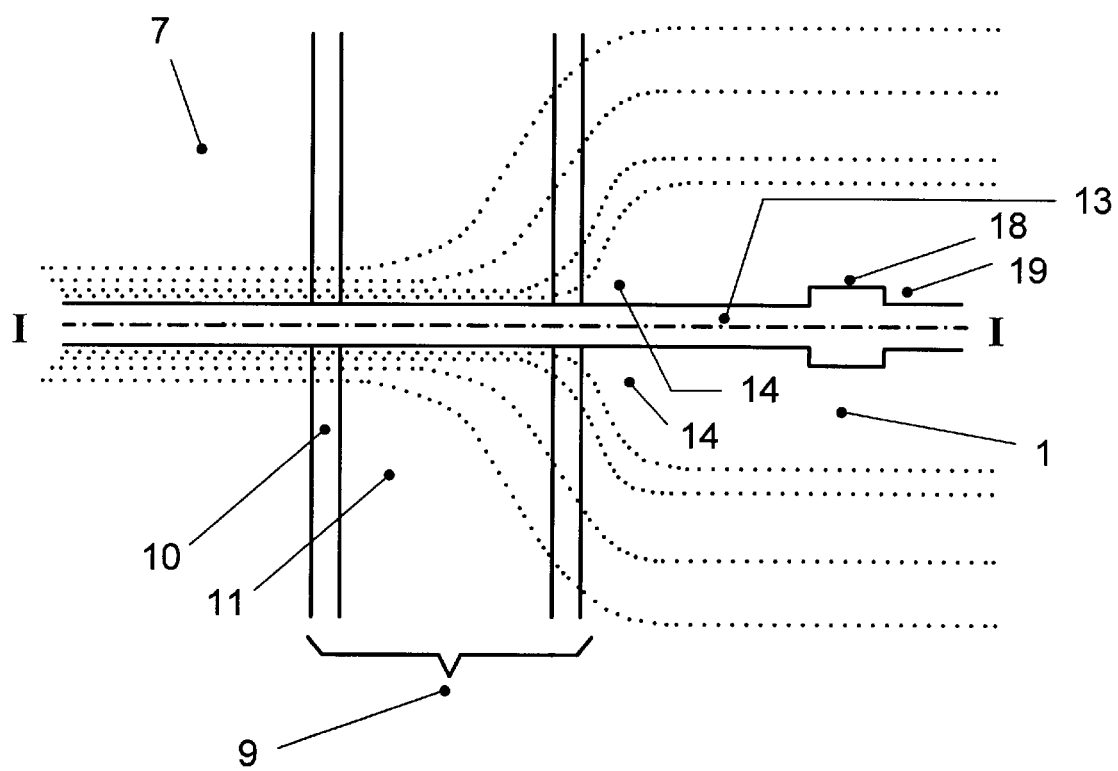
FIG. 1b shows a plan view of iso-potentials in a prior art component.

FIGS. 1a and 1b show a component 1 in the form of a semiconducting island 1 of, for example, silicon, which has been produced on a buried isolator 3 which has been formed on a substrate 5. Component 1 is separated from the surrounding silicon 7 by means of a trench 9 which is filled with isolating material, for example, silicon oxide 10 and polycrystalline silicon 11. A conductor 13 with a high-potential is formed on the part of an isolator 3' which is formed above component 1, surrounding silicon 7 and trench 9. Conductor 13 crosses trench 9 and passes over high-voltage component 1. Conductor 13 is connected to component 1 by means of a contact 18. Contact 18 can be connected to, for example, the anode (if component 1 is a diode) or collector or drain 19 (if component 1 is a transistor) of component 1. Thus a part 19 of component 1 is at a higher potential than surrounding silicon 7 and trench 9. An example of how the iso-potential lines in the high-voltage component 1 could be are shown by dotted lines. The exact distribution of the iso-potential lines naturally depends on the state of the component and vary with its activity. The closer together the iso-potential lines are the greater is the concentration of the electrical field in the material and the easier it is for an avalanche breakdown to occur. It can be seen from the figures that the greatest risk for avalanche breakdown is at the corner 14 of high-voltage component 1 which is nearest to where conductor 13 crosses trench 9. The concentration of the electrical field inside component 1 is highest in corner 14. Avalanche breakdown is undesirable as it affects the function of any component experiencing it.

Figure 2A:
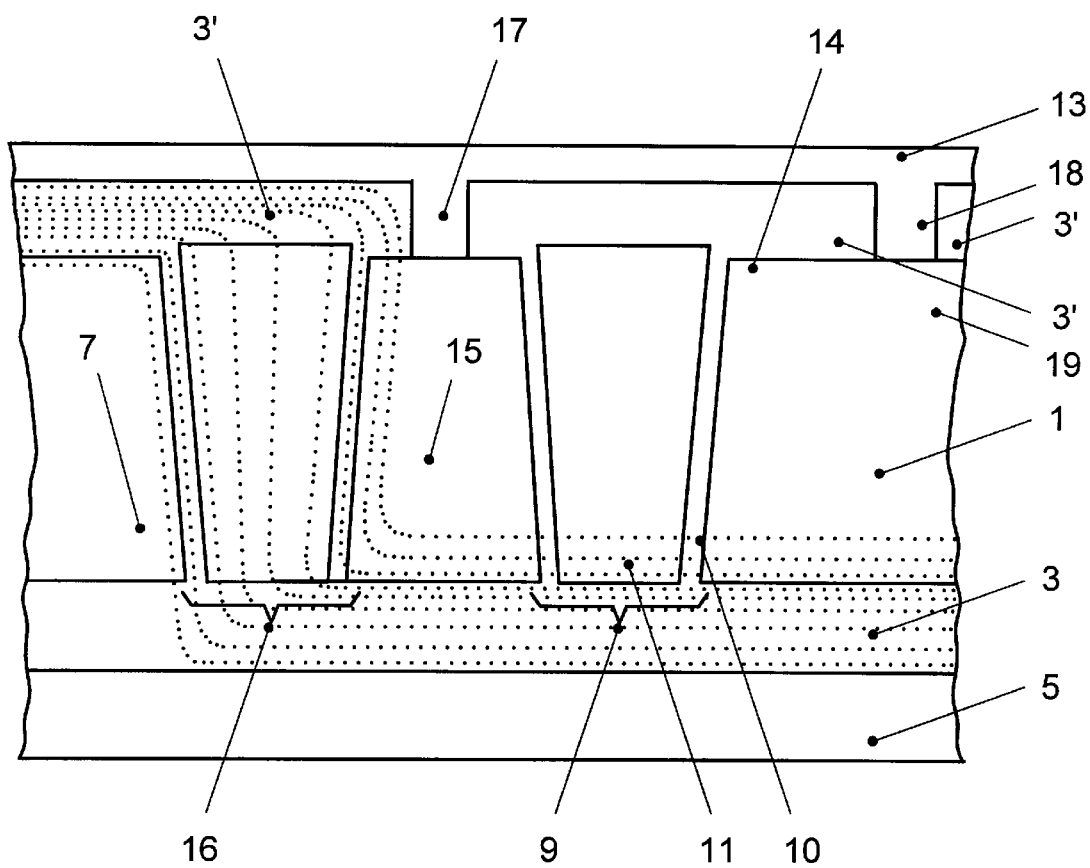
FIG. 2a shows a section through line II—II of the component in FIG. 2b.
Figure 2B:
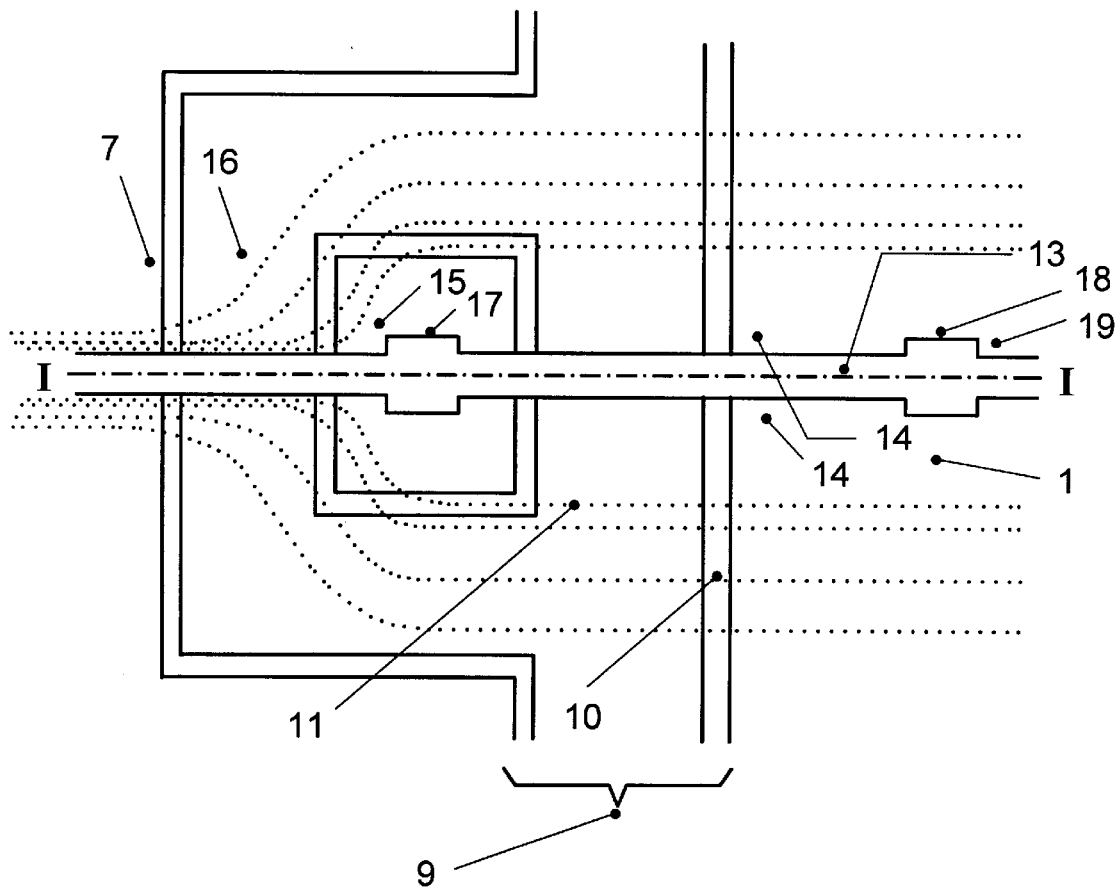
FIG. 2b shows a plan view of iso-potentials in a component constructed according to the invention.

FIGS. 2a and 2b show a similar component provided with avalanche breakdown preventing means according to the present invention. An intermediate conducting region in the form of an island of silicon 15 has been surrounded by a non-conducting trench structure 16 produced in any conventional way. Island 15 is connected to conductor 13 by means of a contact 17. As above conductor 13 is connected to component 1 by means of a contact 18. Contact 18 can be connected to, for example, the anode (if component 1 is a diode) or collector or drain 19 (if component 1 is a transistor) of component 1. Thus a part 19 of component 1 is at a higher potential than surrounding silicon 7 and trench 9.

However, as can be seen by the dotted lines the peak concentrations of the iso-potential lines no longer occur in the component 1 but are in island 15. Hence component 1 can for example work at higher potentials with a reduced risk of avalanche breakdown at corner 14 in the active component. If avalanche breakdown occurs then it will take place in island 15 which preferably does not contain an active component. Thus avalanche breakdown will not affect the functioning of component 1.

Figure 2C:
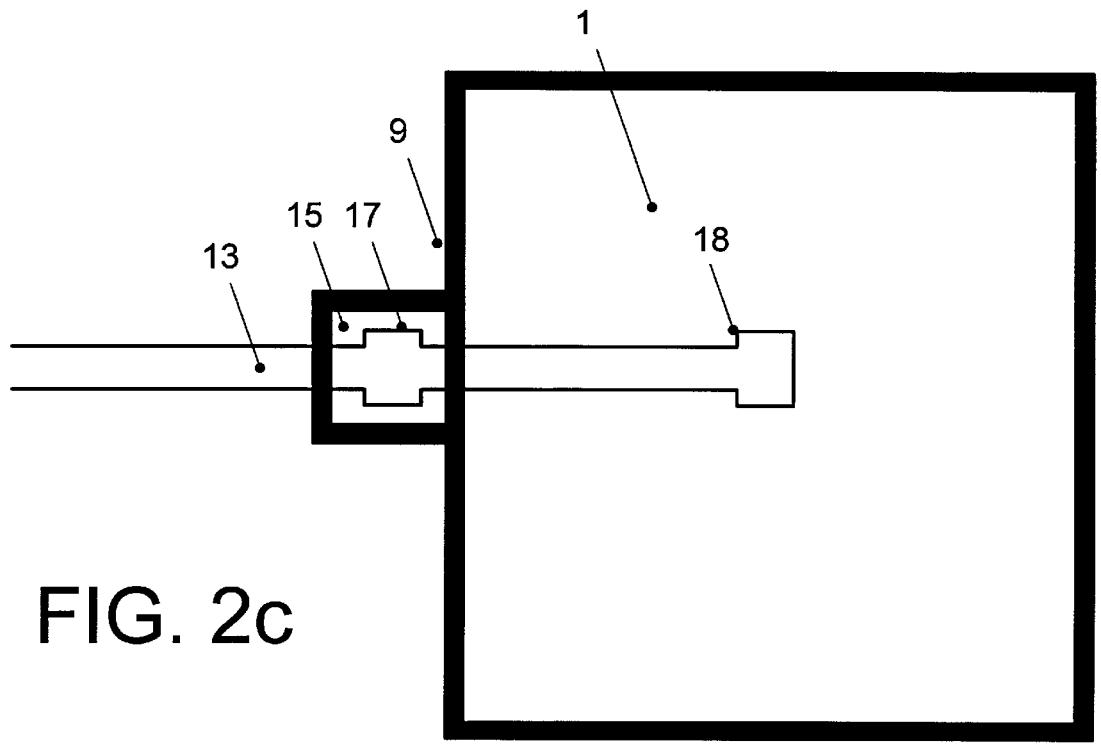
FIG. 2c is a diagram that illustrates an electrical device that has a single conductor according to an exemplary embodiment of the present invention.
Figure 2D:
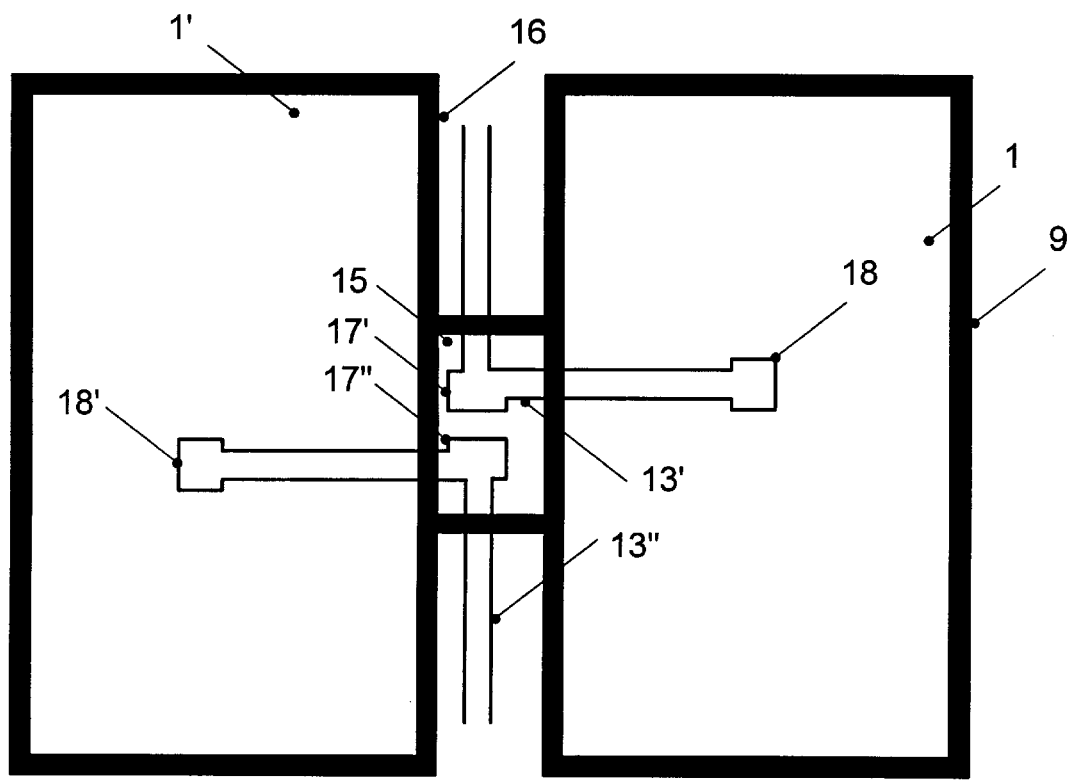
FIG. 2d is a diagram that illustrates an electrical device that has a plurality of conductors according to another exemplary embodiment of the present invention.

FIG. 2c is a diagram that depicts an electrical device in accordance with an exemplary embodiment. As shown in FIG. 2c, a single conductor 13 is connected to island 15 by a single contact 17. FIG. 2d is a diagram that depicts an electrical device in accordance with another exemplary embodiment. As shown in FIG. 2d, a plurality of conductors 13' and 13" are connected to island 15 by a plurality of contacts 17' and 17". Conductor 13" is connected to electrical component 1' by contact 18'.

The optimum size of island 15 depends, amongst others, on the potential difference between the conductor 13 and the adjacent conducting region 7 and components 1, the size of the conductor and the thickness and material of the insulation 3'. In order to save space on the constituent wafer the island 15 should preferably be as small as possible and hence should have a surface area considerably less than that normally used for constructing an electrical component 1. It should be at least less than one half of the size of the component 1 that it is protecting and is preferably less than one tenth the size. In order to enclose the field-concentrations it should be at least as wide as the overlying conductor 13. Preferably the suitable maximum side lengths or diameters for such islands which are attached to a single conductor is in the range of 1–100 μm. It is naturally possible that for manufacturing reasons, it would be preferable to form the island 15 as an elongated rectangle between two parallel trenches 9, 16 which run along substantially the whole length of one or more sides of a component 1. In this case the above given maximum size for the length of a side may need to be surpassed. In order to save space the island 15 preferably should not extend around the whole of the circumference of the component 1 but should be limited to regions underlying conductor(s) 13.

It is conceivable that an island 15 can be formed so as to be connected to two or more conductors in which case the maximum dimension of the island may be much more than 100 μm. However it is still preferable that its width be in the above mentioned ranges of size. In this case the conductors should have approximately the same electrical potential to reduce the risk for avalanche breakdown in the island 15. Preferably any difference in electrical potential should be less than 10 V.

Although it is possible to conceive an arrangement where the island 15 is formed as a functional electrical component such as a resistor, capacitor, diode or transistor, in the preferred arrangement island 15 is inactive, that is, it has no function other than to displace the field strength concentrations away from a nearby component. If island 15 is a functional electrical component then it should be less sensitive to avalanche breakdown than component 1.

Although shown as a rectangular island in the embodiment above, any suitable shape of island 15 could be used in a device according to the invention. The isolating material around the structures mentioned above can be any suitable material or combinations of materials. Suitable materials include doped or undoped armorphous or poly-crystalline silicon, silicon dioxide and/or nitride and/or any other insulating material.

Furthermore the invention is not restricted to use with components produced on a buried isolator but may be adapted for use with any electrical components.

The examples of embodiments of the invention described above relate to electrical devices using silicon as the semiconductor material but are equally applicable to devices using other semiconductor materials.

What is claimed is:

1. An electrical device, comprising:
   an electrical component separated from a conducting region by a first isolating means;
   a conductor extending from the conducting region to a contact on the electrical component; and
   an arrangement for preventing avalanche breakdown in the electrical component, comprising an intermediate conducting region between the conducting region and the electrical component, the intermediate conducting region being separated from the conducting region by a second isolating means, the intermediate conducting region being separated from the electrical component by the first isolating means, the intermediate conducting region being electrically connected to the conductor.

2. The electrical device of claim 1, wherein the electrical component is a semiconductor component.

3. The electrical device of claim 2, wherein the semiconductor component is made of silicon.

4. The electrical device of claim 1, wherein the electrical component further comprises a layer of semiconductor on a buried isolator which has been formed on a semiconductor substrate.

5. The electrical device of claim 1, wherein the intermediate conducting region further comprises a layer of semiconductor material on a buried isolator which has been formed on a semiconductor substrate.

6. The electrical device of claim 1, wherein the second isolating means further comprises an isolating trench.

7. The electrical device of claim 6, wherein the isolating trench further comprises material selected from a group comprising of doped or undoped amorphous or poly-crystalline silicon, silicon dioxide and/or nitride and/or any other insulating material.

8. The electrical device of claim 1, wherein the intermediate conducting region does not comprise an active device.

9. The electrical device of claim 1, wherein the surface area of the intermediate conducting region is less than half the surface area of the electrical component.

10. The electrical device of claim 1, wherein the surface area of the intermediate conducting region is less than one tenth the surface area of the electrical component.

11. The electrical device of claim 1, wherein the intermediate conducting region is in electrical contact with a single conductor.

12. The electrical device of claim 1, wherein the intermediate conducting region is in electrical contact with a plurality of conductors.

13. The electrical device of claim 12, wherein the plurality of conductors each has substantially the same potential.

\* \* \* \* \*